US008679956B2

(12) United States Patent
Tam et al.

(10) Patent No.: US 8,679,956 B2
(45) Date of Patent: *Mar. 25, 2014

(54) MULTIPLE PRECURSOR SHOWERHEAD WITH BY-PASS PORTS

(71) Applicant: Applied Materials, Inc., Santa Clara, CA (US)

(72) Inventors: Alexander Tam, Union City, CA (US); Anzhong Chang, San Jose, CA (US); Sumedh Acharya, Pune (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/751,889

(22) Filed: Jan. 28, 2013

(65) Prior Publication Data
US 2013/0298835 A1    Nov. 14, 2013

Related U.S. Application Data

(63) Continuation of application No. 12/815,557, filed on Jun. 15, 2010, now Pat. No. 8,361,892.

(60) Provisional application No. 61/324,271, filed on Apr. 14, 2010.

(51) Int. Cl.
*H01L 21/36* (2006.01)
*C23C 16/00* (2006.01)

(52) U.S. Cl.
USPC ............................. 438/507; 438/503; 118/715

(58) Field of Classification Search
USPC ........... 438/503, 505, 507, 508, 509; 118/715
See application file for complete search history.

(56) References Cited

U.S. PATENT DOCUMENTS 8,361,892 B2 *   1/2013   Tam et al. ..................... 438/507

* cited by examiner

*Primary Examiner* — Kevin M Picardat
(74) *Attorney, Agent, or Firm* — Patterson & Sheridan, LLP

(57) ABSTRACT

A method and apparatus that includes a processing chamber that includes a showerhead with separate inlets and channels for delivering separate processing gases into a processing volume of the chamber without mixing the gases prior to entering the processing volume is provided. The showerhead includes one or more cleaning gas conduits configured to deliver a cleaning gas directly into the processing volume of the chamber while by-passing the processing gas channels. The showerhead may include a plurality of metrology ports configured to deliver a cleaning gas directly into the processing volume of the chamber while by-passing the processing gas channels. As a result, the processing chamber components can be cleaned more efficiently and effectively than by introducing cleaning gas into the chamber only through the processing gas channels.

16 Claims, 4 Drawing Sheets

US 8,679,956 B2

MULTIPLE PRECURSOR SHOWERHEAD WITH BY-PASS PORTS

CROSS-REFERENCE TO RELATED APPLICATIONS

This application is a continuation application of co-pending U.S. patent application Ser. No. 12/815,557, filed on Jun. 15, 2010, which claims benefit of U.S. Provisional Patent Application Ser. No. 61/324,271, filed Apr. 14, 2010, each of which is herein incorporated by reference.

BACKGROUND OF THE INVENTION

1. Field of the Invention

Embodiments of the present invention generally relate to methods and apparatus for chemical vapor deposition (CVD) on a substrate, and, in particular, to a showerhead design for use in metal organic chemical vapor deposition (MOCVD) and/or hydride vapor phase epitaxy (HVPE).

2. Description of the Related Art

Group III-V films are finding greater importance in the development and fabrication of a variety of semiconductor devices, such as short wavelength light emitting diodes (LEDs), laser diodes (LDs), and electronic devices including high power, high frequency, high temperature transistors and integrated circuits. For example, short wavelength (e.g., blue/green to ultraviolet) LEDs are fabricated using the Group III-nitride semiconducting material gallium nitride (GaN). It has been observed that short wavelength LEDs fabricated using GaN can provide significantly greater efficiencies and longer operating lifetimes than short wavelength LEDs fabricated using non-nitride semiconducting materials, such as Group II-VI materials.

One method that has been used for depositing Group III-nitrides, such as GaN, is metal organic chemical vapor deposition (MOCVD). This chemical vapor deposition method is generally performed in a reactor having a temperature controlled environment to assure the stability of a first precursor gas which contains at least one element from Group III, such as gallium (Ga). A second precursor gas, such as ammonia ($NH_3$), provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface. The quality of the film depends in part upon deposition uniformity which, in turn, depends upon uniform mixing of the precursors across the substrate.

Multiple substrates may be arranged on a substrate carrier and each substrate may have a diameter ranging from 50 mm to 100 mm or larger. The uniform mixing of precursors over larger substrates and/or more substrates and larger deposition areas is desirable in order to increase yield and throughput. These factors are important since they directly affect the cost to produce an electronic device and, thus, a device manufacturer's competitiveness in the marketplace.

Interaction of the precursor gases with the hot hardware components, which are often found in the processing zone of an LED or LD forming reactor, generally causes the precursors to break-down and deposit on these hot surfaces. Typically, the hot reactor surfaces are formed by radiation from the heat sources used to heat the substrates. The deposition of the precursor materials on the hot surfaces can be especially problematic when it occurs in or on the precursor distribution components, such as the showerhead. Deposition on the precursor distribution components affects the flow distribution uniformity over time. Therefore, there is a need for a gas distribution apparatus that prevents or reduces the likelihood that the MOCVD precursors, or HVPE precursors, are heated to a temperature that causes them to break down and affect the performance of the gas distribution device. Additionally, there is a need for more effective apparatus and methods for cleaning components of the reactor and/or precursor distribution components.

Also, as the demand for LEDs, LDs, transistors, and integrated circuits increases, the efficiency of depositing high quality Group-III nitride films takes on greater importance. Therefore, there is a need for an improved deposition apparatus and process that can provide consistent film quality over larger substrates and larger deposition areas.

SUMMARY OF THE INVENTION

The present invention generally provides improved methods and apparatus for depositing Group III-nitride films using MOCVD and/or HVPE processes.

One embodiment of the present invention provides a showerhead apparatus comprising a first gas channel coupled to a first gas inlet, a second gas channel coupled to a second gas inlet, a temperature control channel coupled to a heat exchanging system configured to supply a heat exchanging fluid through the temperature control channel, and a cleaning gas conduit extending through the first gas channel, the second gas channel, and the temperature control channel. The first gas channel is isolated from the second gas channel, and the cleaning gas conduit directly couples a cleaning gas inlet to an exit surface of the showerhead apparatus.

Another embodiment provides a substrate processing apparatus comprising a chamber body, a substrate support, and a showerhead apparatus, wherein a processing volume is defined by the chamber body, the substrate support, and the showerhead apparatus. The showerhead apparatus comprises a first gas channel coupled to a first gas inlet, a second gas channel coupled to a second gas inlet, a temperature control channel coupled to a heat exchanging system configured to supply a heat exchanging fluid through the temperature control channel, and a cleaning gas conduit extending through the first gas channel, the second gas channel, and the temperature control channel. The first gas channel is isolated from the second gas channel and the cleaning gas conduit directly couples a cleaning gas inlet to the processing volume.

Yet another embodiment of the present invention provides a method of processing substrates comprising introducing a first gas into a processing volume of a processing chamber through a first gas inlet coupled to a first gas channel of a showerhead assembly, introducing a second gas into the processing volume of the processing chamber through a second gas inlet coupled to a second gas channel of the showerhead assembly. The first gas channel is isolated from the second gas channel. The first gas is delivered into the processing volume through a plurality of first gas conduits, and the second gas is delivered into the processing volume through a plurality of second gas conduits. The method further comprises cooling the showerhead assembly by flowing a heat exchanging fluid through a temperature control channel disposed in the showerhead assembly, wherein the plurality of first and second gas conduits are disposed through the heat exchanging channel. The method further comprises introducing a cleaning gas into the processing volume of the processing chamber through a cleaning gas conduit directly coupling a cleaning gas inlet with the processing volume of the processing chamber, wherein the cleaning gas conduit extends through and is isolated from the first gas channel, the second gas channel, and the temperature control channel.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally provide a method and apparatus that may be utilized for deposition of Group III-nitride films using MOCVD and/or HVPE precursor gases and hardware. In one embodiment, the apparatus includes a processing chamber that has a showerhead with separate inlets and channels for delivering separate processing gases into a processing volume of the chamber without mixing the gases prior to entering the processing volume. In one embodiment, the showerhead includes one or more cleaning gas conduits configured to deliver a cleaning gas directly into the processing volume of the chamber while by-passing the processing gas channels formed in the showerhead. In one embodiment, the showerhead includes a plurality of metrology ports configured to deliver a cleaning gas directly into the processing volume of the chamber while by-passing the processing gas channels formed in the showerhead. As a result, the processing chamber components can be cleaned more efficiently and effectively than by introducing cleaning gas into the chamber only through the processing gas channels.

Figure 1:
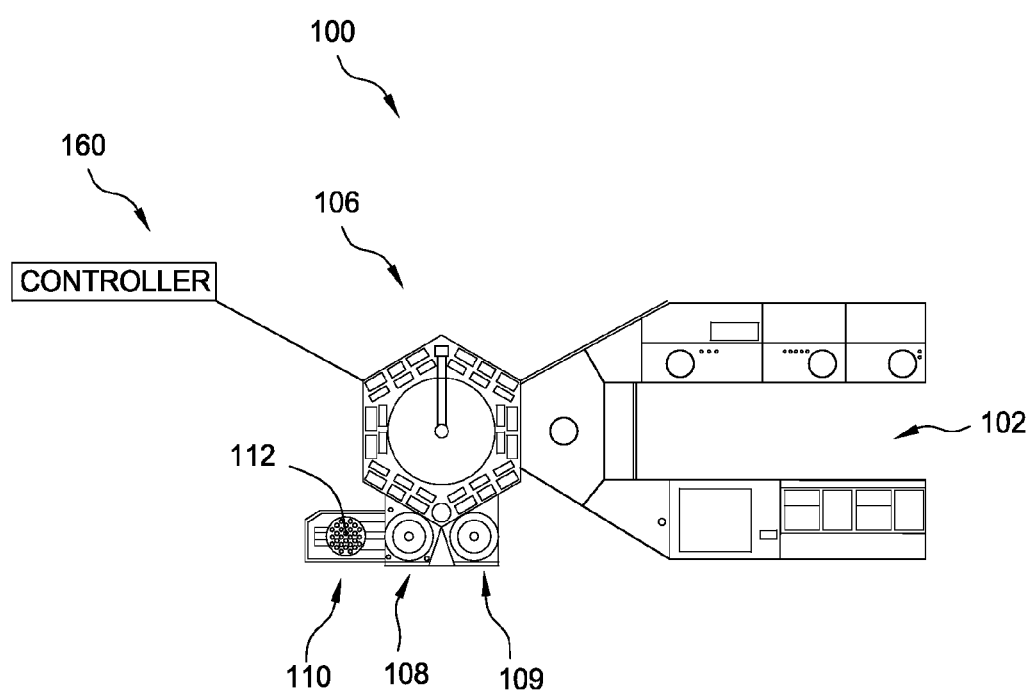
FIG. 1 is a schematic plan view illustrating one embodiment of a processing system for fabricating compound nitride semiconductor devices according to embodiments described herein.

FIG. 1 is a schematic plan view illustrating one embodiment of a processing system 100 that comprises the one or more MOCVD chambers 102 for fabricating compound nitride semiconductor devices according to embodiments described herein. In one embodiment, the processing system 100 is closed to atmosphere. The processing system 100 comprises a transfer chamber 106, a MOCVD chamber 102 coupled with the transfer chamber 106, a loadlock chamber 108 coupled with the transfer chamber 106, a batch loadlock chamber 109, for storing substrates, coupled with the transfer chamber 106, and a load station 110, for loading substrates, coupled with the loadlock chamber 108. The transfer chamber 106 comprises a robot assembly (not shown) operable to pick up and transfer substrates between the loadlock chamber 108, the batch loadlock chamber 109, and the MOCVD chamber 102. Although a single MOCVD chamber 102 is shown, it should be understood that more than one MOCVD chamber 102 or additionally, combinations of one or more MOCVD chambers 102 with one or more Hydride Vapor Phase Epitaxial (HVPE) chambers may also be coupled with the transfer chamber 106. It should also be understood that although a cluster tool is shown, the embodiments described herein may be performed using linear track systems.

In one embodiment, the transfer chamber 106 remains under vacuum during substrate transfer processes. The transfer chamber vacuum level may be adjusted to match the vacuum level of the MOCVD chamber 102. For example, when transferring substrates from a transfer chamber 106 into the MOCVD chamber 102 (or vice versa), the transfer chamber 106 and the MOCVD chamber 102 may be maintained at the same vacuum level. Then, when transferring substrates from the transfer chamber 106 to the load lock chamber 108 (or vice versa) or the batch load lock chamber 109 (or vice versa), the transfer chamber vacuum level may be adjusted to match the vacuum level of the loadlock chamber 108 or batch load lock chamber 109 even through the vacuum level of the loadlock chamber 108 or batch load lock chamber 109 and the MOCVD chamber 102 may be different. Thus, the vacuum level of the transfer chamber 106 is adjustable. In certain embodiments, substrates are transferred in a high purity inert gas environment, such as, a high purity $N_2$ environment. In one embodiment, substrates transferred in an environment having greater than 90% $N_2$. In certain embodiments, substrates are transferred in a high purity $NH_3$ environment. In one embodiment, substrates are transferred in an environment having greater than 90% $NH_3$. In certain embodiments, substrates are transferred in a high purity $H_2$ environment. In one embodiment, substrates are transferred in an environment having greater than 90% $H_2$.

In the processing system 100, the robot assembly (not shown) transfers a substrate carrier plate 112 loaded with substrates into the single MOCVD chamber 102 to undergo deposition. In one embodiment, the substrate carrier plate 112 may have a diameter ranging from about 200 mm to about 750 mm. The substrate carrier plate 112 may be formed from a variety of materials, including SiC or SiC-coated graphite. In one embodiment, the substrate carrier plate 112 comprises a silicon carbide material. In one embodiment, the substrate carrier plate 112 has a surface area of about 1,000 $cm^2$ or more, preferably 2,000 $cm^2$ or more, and more preferably 4,000 $cm^2$ or more. After some or all deposition steps have been completed, the substrate carrier plate 112 is transferred from the MOCVD chamber 102 back to the loadlock chamber 108 via the transfer robot. In one embodiment, the substrate carrier plate 112 is then transferred to the load station 110. In another embodiment, the substrate carrier plate 112 may be stored in either the loadlock chamber 108 or the batch load lock chamber 109 prior to further processing in the MOCVD chamber 102. One exemplary processing system 100 that may be adapted in accordance with embodiments of the present invention is described in U.S. patent application Ser. No. 12/023,572, filed Jan. 31, 2008, now published as US 2009-0194026, entitled PROCESSING SYSTEM FOR FABRICATING COMPOUND NITRIDE SEMICONDUCTOR DEVICES, which is hereby incorporated by reference in its entirety.

In one embodiment, a system controller 160 controls activities and operating parameters of the processing system 100. The system controller 160 includes a computer processor and a computer-readable memory coupled to the processor. The processor executes system control software, such as a computer program stored in memory. Exemplary aspects of the processing system 100 and methods of use adaptable to embodiments of the present invention are further described in U.S. patent application Ser. No. 11/404,516, filed Apr. 14, 2006, now published as U.S. 2007-024516, entitled EPITAXIAL GROWTH OF COMPOUND NITRIDE STRUCTURES, which is hereby incorporated by reference in its entirety.

Figure 2:
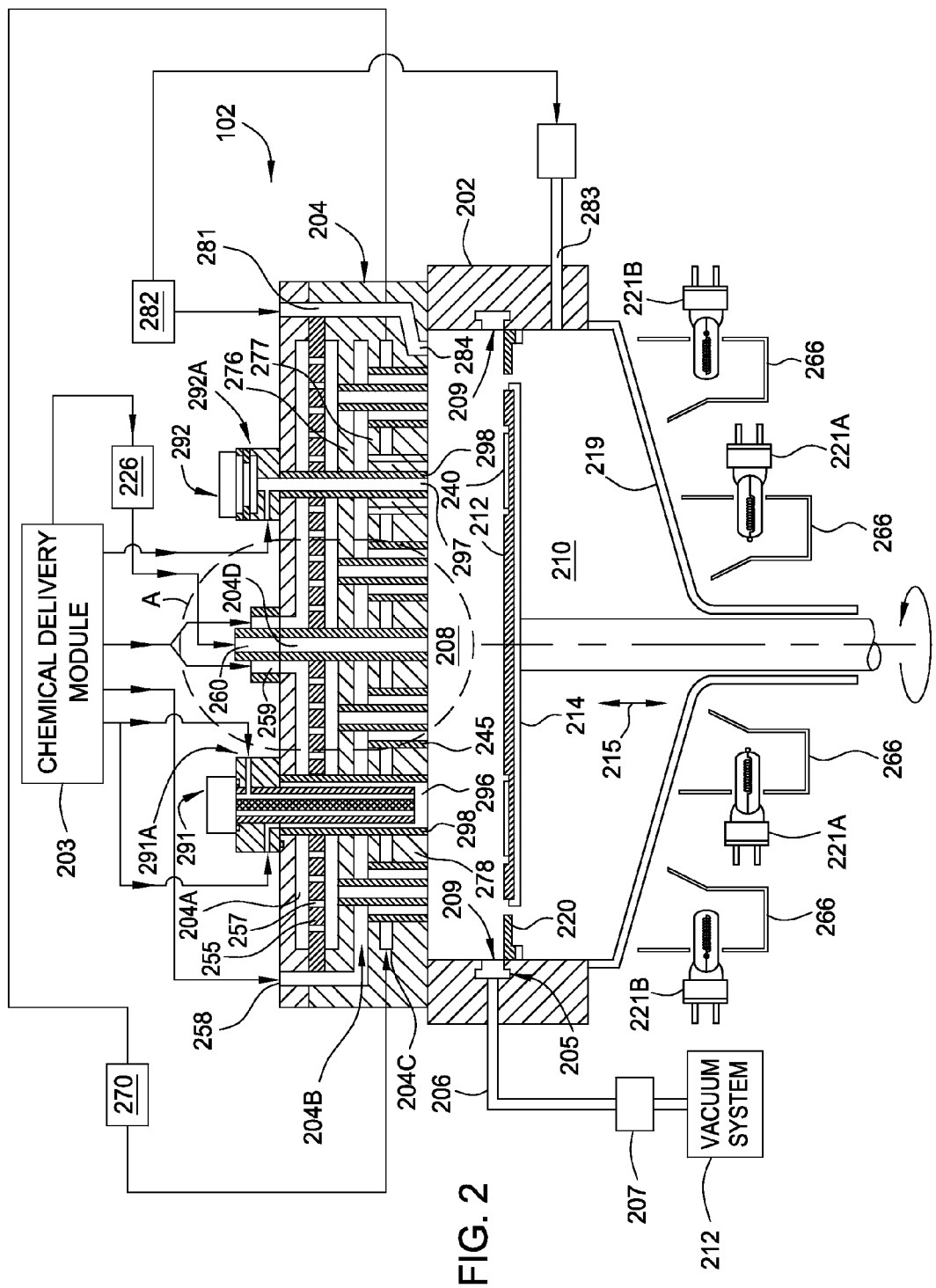
FIG. 2 is a schematic cross-sectional view of a metal-organic chemical vapor deposition (MOCVD) chamber for fabricating compound nitride semiconductor devices according to one embodiment of the present invention.

FIG. 2 is a schematic cross-sectional view of the MOCVD chamber 102 according to embodiments of the present invention. The MOCVD chamber 102 comprises a chamber body 202, a chemical delivery module 203 for delivering precursor gases, carrier gases, cleaning gases, and/or purge gases, a susceptor or substrate support 214, and a vacuum system 212. The chamber body 202 encloses a processing volume 208. A showerhead assembly 204 is disposed at one end of the processing volume 208, and the substrate carrier plate 112 is disposed at the other end of the processing volume 208. The substrate carrier plate 112 may be disposed on the substrate support 214. The substrate support 214 has z-lift capability for moving in a vertical direction, as shown by arrow 215. In one embodiment, the z-lift capability may be used to move the substrate support 214 upwardly, and closer to the showerhead assembly 204, and downwardly, and further away from the showerhead assembly 204. In one embodiment, the distance from the surface of the showerhead assembly 204 that is adjacent the processing volume 208 to the substrate carrier plate 112 during processing ranges from about 4 mm to about 41 mm. In certain embodiments, the substrate support 214 comprises a heating element (e.g., a resistive heating element (not shown)) for controlling the temperature of the substrate support 214 and consequently controlling the temperature of the substrate carrier plate 112 and substrates 240 positioned on the substrate carrier plate 112 and the substrate support 214.

In one embodiment, the showerhead assembly 204 has a first processing gas channel 204A coupled with the chemical delivery module 203 via a first processing gas inlet 259 for delivering a first precursor or first process gas mixture to the processing volume 208. In one embodiment, the chemical delivery module 203 is configured to deliver a metal organic precursor to the first processing gas channel 204A. In one example, the metal organic precursor comprises a suitable gallium (Ga) precursor (e.g., trimethyl gallium ("TMG"), triethyl gallium (TEG)), a suitable aluminum precursor (e.g., trimethyl aluminum ("TMA")), or a suitable indium precursor (e.g., trimethyl indium ("TMI")).

In one embodiment, a blocker plate 255 is positioned across the first processing gas channel 204A. The blocker plate 255 has a plurality of orifices 257 disposed therethrough. In one embodiment, the blocker plate 255 is positioned between the first processing gas inlet 259 and the first processing gas channel 204A for uniformly distributing gas received from the chemical delivery module 203 into the first processing gas channel 204A.

In one embodiment, the showerhead assembly 204 has a second processing gas channel 204B coupled with the chemical delivery module 203 for delivering a second precursor or second process gas mixture to the processing volume 208 via a second processing gas inlet 258. In one embodiment, the chemical delivery module 203 is configured to deliver a suitable nitrogen containing processing gas, such as ammonia ($NH_3$) or other MOCVD or HVPE processing gas, to the second processing gas channel 204B. In one embodiment, the second processing gas channel 204B is separated from the first processing gas channel 204A by a first horizontal wall 276 of the showerhead assembly 204.

The showerhead assembly 204 may further include a temperature control channel 204C coupled with a heat exchanging system 270 for flowing a heat exchanging fluid through the showerhead assembly 204 to help regulate the temperature of the showerhead assembly 204. Suitable heat exchanging fluids include, but are not limited to, water, water-based ethylene glycol mixtures, a perfluoropolyether (e.g., Galden® fluid), oil-based thermal transfer fluids, or similar fluids. In one embodiment, the second processing gas channel 204B is separated from the temperature control channel 204C by a second horizontal wall 277 of the showerhead assembly 204. The temperature control channel 204C may be separated from the processing volume 208 by a third horizontal wall 278 of the showerhead assembly 204.

In one embodiment, the showerhead assembly 204 includes a first metrology assembly 291 attached to a first metrology port 296 and a second metrology assembly 292 attached to a second metrology port 297. The first and second metrology ports 296, 297, each include a metrology conduit 298 that is positioned in an aperture formed through the showerhead assembly 204 and attached to the showerhead assembly 204, such as by brazing, such that each of the channels (204A, 204B, and 204C) are separated and sealed from one another. The first and second metrology assemblies 291, 292 are used to monitor the processes performed on the surface of the substrates 240 disposed in the processing volume 208 of the chamber 102. In one embodiment, the first metrology assembly 291 includes a temperature measurement device, such as an optical pyrometer.

In one embodiment, the second metrology assembly 292 includes an optical measurement device, such as an optical stress, or substrate bow, measurement device. Generally, the optical measurement device (not shown) includes an optical emitter, such as a light source, for emitting one or more beams of light through a sensor window disposed in the second metrology port 297. The beams of light are generally focused through the sensor window onto a substrate 240 disposed in the processing volume 208 of the chamber 102. The beams of light strike the substrate 240 and are reflected back through the sensor window and received by an optical detector within the optical measurement device. The received beams of light are then compared with the emitted beams of light to determine a property of the substrate 240, such as the amount of bow of the substrate 240 (i.e., amount of convex or concave curvature of the upper surface of the substrate 240).

In one embodiment, the first metrology assembly 291 and the second metrology assembly 292 include a first gas assembly 291A and a second gas assembly 292A, respectively, that are adapted to deliver and position a gas from the chemical delivery module 203 through the metrology conduits 298 and into the processing volume 208 of the chamber 102. In one embodiment, the chemical delivery module 203 provides a purge gas to the first and second gas assemblies 291A, 292A so as to prevent deposition of material on the surface of components within the assemblies. In one embodiment, the chemical delivery module 203 provides a cleaning gas, such as a halogen containing gas, to the first and second gas assemblies 291A, 292A both to clean the surface of components within the assemblies and to deliver the cleaning gas directly into the processing volume 208 of the chamber 102 to clean components of the chamber 102 without being distributed through the first processing gas channel 204A or the second processing gas channel 204B. In one embodiment, the showerhead assembly 204 has a plurality of first metrology ports 296 and/or a plurality of second metrology ports 297, and the showerhead assembly 204 has a respective plurality of first and/or second metrology assemblies 291, 292 and first and/or second gas assemblies 291A, 292A attached thereto, respectively.

In certain embodiments, the showerhead assembly 204 includes one or more cleaning gas conduits 204D coupled with the chemical delivery module 203 via a cleaning gas inlet 260 for delivering a cleaning gas, such as a halogen containing gas, directly through the showerhead assembly 204 and into the processing volume 208 without being distributed through the first processing gas channel 204A or the second processing gas channel 204B. In one embodiment, the chemical delivery module 203 is configured to deliver a cleaning gas, such as fluorine ($F_2$) gas, chlorine ($Cl_2$) gas, bromine ($Br_2$) gas, and iodine ($I_2$) gas through the one or more cleaning gas conduits 204D, and/or the metrology conduits 298, directly into the processing volume 208 of the chamber 102. In another embodiment, the chemical delivery module 203 is configured to deliver a cleaning gas comprising hydrogen iodide (HI), hydrogen chloride (HCl), hydrogen bromide (HBr), hydrogen fluoride (HF), nitrogen trifluoride ($NF_3$), and/or other similar gases. In one embodiment, diatomic chlorine ($Cl_2$) gas is used as the cleaning gas. In another embodiment, diatomic fluorine ($F_2$) gas is used as the cleaning gas. In one embodiment, after entering the processing volume 208, the cleaning gas is distributed thereabout, to remove deposits from chamber components, such as the substrate support 214, the surface of the showerhead assembly 204, and the walls of the chamber body 202, and removed from the chamber 102 via exhaust ports 209, which are disposed about an annular exhaust channel 205 disposed within walls of the chamber body 202. In another embodiment, a remote plasma source 226 may be provided to generate plasma from the cleaning gas received from the chemical delivery module 203 to be flowed into the processing volume 208 of the chamber 102 for cleaning the components thereof.

Figure 3:
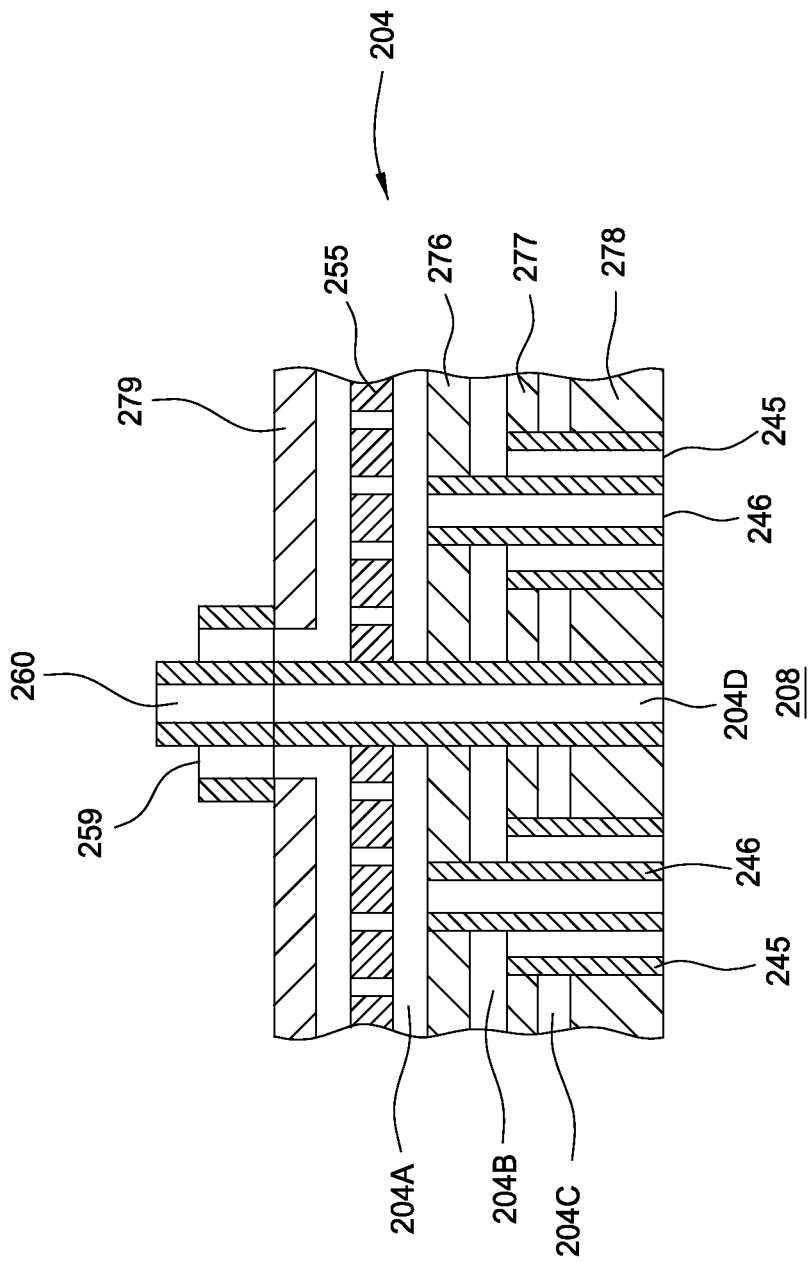
FIG. 3 is an enlarged view of detail A shown in FIG. 2.

FIG. 3 is an enlarged view of detail A shown in FIG. 2. Referring to FIGS. 2 and 3, in one embodiment, the first precursor or first processing gas mixture, such as a metal organic precursor, is delivered from the first processing gas channel 204A through the second processing gas channel 204B and the temperature control channel 204C into the processing volume 208 via a plurality of inner gas conduits 246. The inner gas conduits 246 may be cylindrical tubes located within aligned holes disposed through the first horizontal wall 276, the second horizontal wall 277, and the third horizontal wall 278 of the showerhead assembly 204. In one embodiment, the inner gas conduits 246 are each attached to the first horizontal wall 276 of the showerhead assembly 204 by suitable means, such as brazing.

In one embodiment, the second precursor or second processing gas mixture, such as a nitrogen precursor, is delivered from the second processing gas channel 204B through the temperature control channel 204C and into the processing volume 208 via a plurality of outer gas conduits 245. The outer gas conduits 245 may be cylindrical tubes each located concentrically about a respective inner gas conduit 246. The outer gas conduits 245 are located within the aligned holes disposed through the second horizontal wall 277 and the third horizontal wall 278 of the showerhead assembly 204. In one embodiment, the outer gas conduits 245 are each attached to the second horizontal wall 277 of the showerhead assembly 204 by suitable means, such as brazing.

Periodically, it is desirable to clean the components of the chamber 102 between deposition processes. In one embodiment, a cleaning gas is delivered from the chemical delivery module 203 through the first processing gas channel 204A, the second processing gas channel 204B, and the temperature control channel 204C via the one or more cleaning gas inlets 260 and cleaning gas conduits 204D and into the processing volume 208 of the chamber 102. Each cleaning gas conduit 204D may be a cylindrical tube located within aligned holes disposed through a top horizontal wall 279, the first horizontal wall 276, the second horizontal wall 277, and the third horizontal wall 278 of the showerhead assembly 204. In one embodiment, each cleaning gas conduit 204D is attached to the first horizontal wall 276, the second horizontal wall 277, and the third horizontal wall 278 of the showerhead assembly 204 by suitable means, such as brazing, such that each of the channels (204A, 204B, and 204C) of the showerhead assembly are separated and isolated from one another.

In one embodiment, the showerhead assembly 204 may contain a single cleaning gas conduit 204D located at a central point in the showerhead assembly 204 as shown in FIGS. 2 and 3. In one embodiment, the showerhead assembly 204 may contain additional cleaning gas conduits 204D located at various locations within the showerhead assembly 204.

In one embodiment, the cleaning gas is further distributed through the first processing gas channel 204A and/or second processing gas channel 204B through their respective gas inlets (259, 258). The cleaning gas is then routed through inner gas conduits 246 and/or outer gas conduits 245, respectively. In such an embodiment, the cleaning gas reacts with deposits and/or precursor gases within the first and/or or second processing gas channels (204A, 204B) and inner and/or outer gas conduits (246, 245) to clean the respective regions within the showerhead assembly 204. However, a substantial portion of the cleaning gas has already reacted with the particles and/or gases within the showerhead assembly 204 by the time it reaches the processing volume 208 of the chamber 102. Thus, because the cleaning gas has been scavenged by the time it reaches the processing volume 208, cleaning components that are in contact with the processing volume 208 only through the processing gas passages is relatively time consuming, inefficient, and ineffective.

As previously described, embodiments of the present invention directs the cleaning gas directly through the showerhead assembly 204 via the cleaning gas conduit 204D, and/or the metrology conduits 298, which by-pass the first and second processing gas channels (204A, 204B). As a result, the highly reactive cleaning gas is distributed into and about the processing volume 208 prior to reacting with deposits and precursor gases located within the showerhead assembly 204. This enables more efficient and direct cleaning of components within the processing volume 208, such as the substrate support 214, the surface of the showerhead assembly 204, and the chamber body 202 than if the cleaning gas were only distributed through the first and second processing gas channels (204A, 204B) and gas conduits (246, 245) of the showerhead assembly 204. In one embodiment, a cleaning gas that is delivered through the cleaning gas conduit 204D, and/or the metrology conduits 298, is used to directly clean the surface of one or more substrates 240, which are disposed in the processing volume 208, prior to depositing a layer thereon (e.g., Group III-nitride film). In another embodiment, a cleaning gas that is delivered through the cleaning gas conduit 204D, and/or the metrology conduits 298, is used to directly clean an empty carrier plate 112 that is disposed in the processing volume 208, to remove any unwanted deposited material (e.g., Group III-nitride film) disposed thereon. Thus, by delivering the cleaning gas directly through the showerhead and by-passing the processing gas distribution channels, the components of the processing chamber are efficiently cleaned while reducing scavenging effects that would be associated with delivering cleaning gases only through showerhead processing gas passages.

In one embodiment, each processing chamber 102 may be cleaned after the deposition of the Group III-nitride film on one or more of the substrates 240 that are disposed on a first carrier plate 112, and prior to insertion of a second carrier plate 112 containing a second set of one or more substrates 240. In one embodiment, the chamber components in each processing chamber 102 may be cleaned periodically. In one embodiment, the frequency and/or duration of each cleaning may be determined based on the thickness of each layer deposited. For example, a cleaning process performed after deposition of a thin layer is shorter than a cleaning process performed after deposition of a thicker layer. In one example, a first processing chamber 102 may be cleaned after each u-GaN and n-GaN deposition process. In one embodiment, the processing chamber 102 may be cleaned periodically, for example after 50 deposition cycles. In one embodiment, another processing chamber 102 may be cleaned after the removal of each carrier plate 112.

Figure 4:
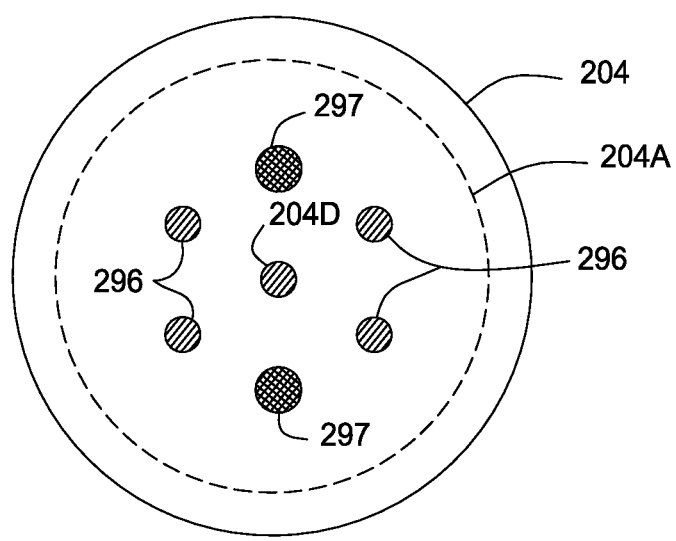
FIG. 4 is a schematic, bottom view of the showerhead assembly shown in FIG. 2.

FIG. 4 is a schematic, bottom view of the showerhead assembly 204 shown in FIG. 2 according to one embodiment of the invention. In one embodiment, the showerhead assembly 204 includes the cleaning gas conduit 204D positioned at the center of the showerhead assembly 204 and a plurality of first and second metrology assemblies 296, 297 arranged in a concentric pattern about the cleaning gas conduit 204D. In one embodiment, the first and second metrology assemblies 296, 297 are positioned such that they are centered over a central portion of the substrates 240 (FIG. 2) disposed on the carrier plate 112 (FIG. 2) as it is rotated during processing.

Referring back to FIG. 2, a lower dome 219 is disposed at one end of a lower volume 210, and the substrate carrier plate 112 is disposed at the other end of the lower volume 210. The substrate carrier plate 112 is shown in an elevated, process position, but may be moved to a lower position where, for example, the substrates 240 may be loaded or unloaded. An exhaust ring 220 may be disposed around the periphery of the substrate carrier plate 112 to help prevent deposition from occurring in the lower volume 210 and also help direct exhaust gases from the chamber 102 to the exhaust ports 209. The lower dome 219 may be made of transparent material, such as high-purity quartz, to allow light to pass through for radiant heating of the substrates 240. The radiant heating may be provided by a plurality of inner lamps 221A and outer lamps 221B disposed below the lower dome 219. Reflectors 266 may be used to help control exposure of the chamber 102 to the radiant energy provided by the inner and outer lamps 221A, 221B. Additional rings of lamps (not shown) may also be used for finer temperature control of the substrates 240.

In certain embodiments of the present invention, a purge gas (e.g., a nitrogen containing gas) is delivered into the chamber 102 from the showerhead assembly 204 through one or more purge gas channels 281 coupled to a purge gas source 282. In this embodiment, the purge gas is distributed through a plurality of orifices 284 about the periphery of the showerhead assembly 204. The plurality of orifices 284 may be configured in a circular pattern about the periphery of the showerhead assembly 204 and positioned distribute the purge gas about the periphery of the substrate carrier plate 112 to prevent undesirable deposition on edges of the substrate carrier plate 112, the showerhead assembly 204, and other components of the chamber 102, which result in particle formation and, ultimately contamination of the substrates 240. The purge gas flows downwardly into multiple exhaust ports 209, which are disposed around the annular exhaust channel 205. An exhaust conduit 206 connects the annular exhaust channel 205 to a vacuum system 212, which includes a vacuum pump 207. The pressure of the chamber 102 may be controlled using a valve system, which controls the rate at which the exhaust gases are drawn from the annular exhaust channel 205.

In other embodiments, purge gas tubes 283 are disposed near the bottom of the chamber body 102. In this configuration, the purge gas enters the lower volume 210 of the chamber 102 and flows upwardly past the substrate carrier plate 112 and exhaust ring 220 and into the multiple exhaust ports 209.

The chemical delivery module 203 supplies chemicals to the MOCVD chamber 102. Reactive gases (e.g., first and second precursor gases), carrier gases, purge gases, and cleaning gases may be supplied from the chemical delivery system through supply lines and into the chamber 102. In one embodiment, the gases are supplied through supply lines and into a gas mixing box where they are mixed together and delivered to the showerhead assembly 204. Generally supply lines for each of the gases include shut-off valves that can be used to automatically or manually shut-off the flow of the gas into its associated line, and mass flow controllers or other types of controllers that measure the flow of gas or liquid through the supply lines. Supply lines for each of the gases may also include concentration monitors for monitoring precursor concentrations and providing real time feedback. Backpressure regulators may be included to control precursor gas concentrations. Valve switching control may be used for quick and accurate valve switching capability. Moisture sensors in the gas lines measure water levels and can provide feedback to the system software which in turn can provide warnings/alerts to operators. The gas lines may also be heated to prevent precursors and cleaning gases from condensing in the supply lines. Depending upon the process used some of the sources may be liquid rather than gas. When liquid sources are used, the chemical delivery module includes a liquid injection system or other appropriate mechanism (e.g., a bubbler) to vaporize the liquid. Vapor from the liquids is then usually mixed with a carrier gas as would be understood by a person of skill in the art.

The temperature of the walls of the MOCVD chamber 102 and surrounding structures, such as the exhaust passageway, may be further controlled by circulating a heat-exchange liquid through channels (not shown) in the walls of the chamber 102. The heat-exchange liquid can be used to heat or cool the chamber body 202 depending on the desired effect. For example, hot liquid may help maintain an even thermal gradient during a thermal deposition process, whereas a cool liquid may be used to remove heat from the system during an in-situ plasma process, or to limit formation of deposition products on the walls of the chamber. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

In one embodiment, during processing, a first precursor gas flows from the first processing gas channel 204A in the showerhead assembly 204 and a second precursor gas flows from the second processing gas channel 204B formed in the showerhead assembly 204 towards the surface of the substrates 240. As noted above, the first precursor gas and/or second precursor gas may comprise one or more precursor gases or process gasses as well as carrier gases and dopant gases which may be mixed with the precursor gases. The draw of the exhaust ports 209 may affect gas flow so that the process gases flow substantially tangential to the substrates 240 and may be uniformly distributed radially across the substrate deposition surfaces in a laminar flow. In one embodiment, the processing volume 208 may be maintained at a pressure of about 760 Torr down to about 80 Torr.

Exemplary showerheads that may be adapted to practice embodiments described herein are described in U.S. patent application Ser. No. 11/873,132, filed Oct. 16, 2007, now published as U.S. 2009-0098276, entitled MULTI-GAS STRAIGHT CHANNEL SHOWERHEAD, U.S. patent application Ser. No. 11/873,141, filed Oct. 16, 2007, now published as U.S. 2009-0095222, entitled MULTI-GAS SPIRAL CHANNEL SHOWERHEAD, and U.S. patent application Ser. No. 11/873,170, filed Oct. 16, 2007, now published as U.S. 2009-0095221, entitled MULTI-GAS CONCENTRIC INJECTION SHOWERHEAD, all of which are incorporated by reference in their entireties. Other aspects of the MOCVD chamber 102 are described in U.S. patent application Ser. No. 12/023,520, filed Jan. 31, 2008, published as U.S. 2009-0194024, and titled CVD APPARATUS, which is herein incorporated by reference in its entirety.

In summary, embodiments of the present invention include a showerhead assembly having concentric tube assemblies for separately delivering processing gases into a processing volume of a processing chamber. The showerhead assembly further includes one or more cleaning gas conduits configured to bypass the concentric tube assemblies and deliver a cleaning gas directly through the showerhead assembly into the processing volume of the processing chamber. The showerhead assembly may also include a plurality of metrology conduits configured to deliver a cleaning gas directly through the showerhead assembly into the processing volume of the processing chamber. By delivering the cleaning gas directly through the showerhead and bypassing the processing gas distribution channels, the components of the processing chamber are efficiently cleaned while reducing scavenging effects associated with delivering cleaning gases through showerhead processing gas passages.

While the foregoing is directed to embodiments of the present invention, other and further embodiments of the invention may be devised without departing from the basic scope thereof, and the scope thereof is determined by the claims that follow.

The invention claimed is:

1. A showerhead apparatus, having:
   a first gas channel coupled to a first gas inlet;
   a second gas channel coupled to a second gas inlet, wherein the first gas channel is isolated from the second gas channel;
   a temperature control channel coupled to a heat exchanging fluid inlet; and
   a cleaning gas conduit extending through the first gas channel, the second gas channel, and the temperature control channel, wherein the cleaning gas conduit directly couples a cleaning gas inlet to an exit surface of the showerhead apparatus.

2. The apparatus of claim 1, wherein the cleaning gas conduit is a cylindrical tube directly coupling the cleaning gas inlet with the exit surface of the showerhead assembly.

3. The apparatus of claim 2, wherein the cleaning gas conduit is centrally located in the showerhead apparatus.

4. The apparatus of claim 3, wherein the first gas inlet is concentric about the cleaning gas inlet.

5. The apparatus of claim 1, further comprising a plurality of metrology conduits extending through the first gas channel, the second gas channel, and the temperature control channel, wherein each metrology conduit directly couples a metrology port to the exit surface of the showerhead apparatus.

6. A showerhead apparatus, having:
   a first gas channel coupled to a first gas inlet;
   a second gas channel coupled to a second gas inlet, wherein the first gas channel is isolated from the second gas channel;
   a temperature control channel, wherein the temperature control channel is isolated from the first and second gas channels; and
   a cleaning gas conduit extending through the first gas channel, the second gas channel, and the temperature control channel, wherein the cleaning gas conduit directly couples a cleaning gas inlet to an exit surface of the showerhead apparatus.

7. The apparatus of claim 6, wherein the cleaning gas conduit is a cylindrical tube directly coupling the cleaning gas inlet with the exit surface of the showerhead assembly.

8. The apparatus of claim 7, wherein the cleaning gas conduit is centrally located in the showerhead apparatus.

9. The apparatus of claim 8, wherein the first gas inlet is concentric about the cleaning gas inlet.

10. The apparatus of claim 1, further comprising a plurality of metrology conduits extending through the first gas channel, the second gas channel, and the temperature control channel, wherein each metrology conduit directly couples a metrology port to the exit surface of the showerhead apparatus.

11. A substrate processing apparatus, comprising:
    a chamber body;
    a substrate support; and
    a showerhead apparatus, wherein a processing volume is defined by the chamber body, the substrate support, and the showerhead apparatus, and wherein the showerhead apparatus has:
      a first gas channel coupled to a first gas inlet;
      a second gas channel coupled to a second gas inlet, wherein the first gas channel is isolated from the second gas channel;
      a temperature control channel coupled to a heat exchanging fluid inlet; and
      a cleaning gas conduit extending through the first gas channel, the second gas channel, and the temperature control channel, wherein the cleaning gas conduit directly couples a cleaning gas inlet to the processing volume.

12. The apparatus of claim 11, wherein the cleaning gas inlet is a tube that directly couples the cleaning gas inlet to the processing volume.

13. The apparatus of claim 12, wherein the cleaning gas conduit is centrally located in the showerhead assembly.

14. The apparatus of claim 11, further comprising a plurality of metrology conduits extending through the first gas channel, the second gas channel, and the temperature control channel, wherein each metrology conduit directly couples a metrology port to the processing volume.

15. The apparatus of claim 14, wherein each metrology port is coupled to a metrology assembly and a gas assembly, and wherein each gas assembly is coupled to the cleaning gas source.

16. The apparatus of claim 15, wherein the plurality of metrology conduits are configured concentrically about the cleaning gas conduit.

\* \* \* \* \*